United States Patent [19]

Pedelaborde-Augas et al.

[11] Patent Number: 4,766,518
[45] Date of Patent: Aug. 23, 1988

[54] BOX FOR THE THERMAL STABILIZATION OF EQUIPMENT, SUCH AS ELECTRONIC COMPONENTS CONTAINED THEREIN

[75] Inventors: Didier Pedelaborde-Augas; Philippe Pillois; Yves Valy, all of Saint Medard en Jalles, France

[73] Assignee: Aerospatiale Societe Nationale Industrielle, Paris Cedex, France

[21] Appl. No.: 40,311

[22] Filed: Apr. 20, 1987

[30] Foreign Application Priority Data

Apr. 21, 1986 [FR] France .................. 86 05713

[51] Int. Cl.[4] .................................. H05K 7/20
[52] U.S. Cl. ........................ 361/389; 361/387; 165/185
[58] Field of Search ............... 361/386, 388, 387, 389; 165/185; 312/236; 174/16 HS

[56] References Cited

U.S. PATENT DOCUMENTS

| 2,863,994 | 12/1958 | Kohring . | |
|---|---|---|---|
| 2,961,478 | 11/1960 | Burns . | |
| 3,013,186 | 12/1961 | Jones | 165/185 |
| 3,187,226 | 6/1965 | Kates . | |
| 3,280,907 | 10/1966 | Hoffman | 165/185 |
| 3,388,739 | 6/1968 | Olson et al. | 165/185 |
| 4,060,847 | 11/1977 | Penrod | 361/386 |
| 4,190,879 | 2/1980 | Tissot | 361/386 |
| 4,330,812 | 5/1982 | Token . | |
| 4,599,680 | 7/1986 | Gibson et al. | 361/386 |
| 4,646,203 | 2/1987 | Ngo et al. | 165/185 |

FOREIGN PATENT DOCUMENTS

| 300275 | 2/1980 | European Pat. Off. | 165/185 |
|---|---|---|---|
| 1187284 | 2/1965 | Fed. Rep. of Germany . | |
| 8130300 | 1/1982 | Fed. Rep. of Germany . | |

*Primary Examiner*—Ira S. Lazarus
*Assistant Examiner*—Sue Hagarman
*Attorney, Agent, or Firm*—Pearne, Gordon, McCoy & Granger

[57] ABSTRACT

Heat sources such as electronic components are distributed in accordance with a given cartography within a box essentially constituted by a rigid structure made from a thermally insulating material. In order to ensure the thermal stabilization of these sources, they are contacted with implants mounted on the internal surface of the box and for certain of them with inserts which are themselves in thermal contact with external radiators. The implants, inserts and radiators are made from thermally conductive materials.

14 Claims, 1 Drawing Sheet

BOX FOR THE THERMAL STABILIZATION OF EQUIPMENT, SUCH AS ELECTRONIC COMPONENTS CONTAINED THEREIN

BACKGROUND OF THE INVENTION

The invention relates to a box for equipment such as electronic components incorporating heat sources distributed in accordance with a given cartography. More specifically, the invention relates to a box essentially made from a thermally insulating material and having means of a passive nature making it possible to dissipate the heat given off by the equipment contained therein.

Although the invention is particularly adapted to the case of a box containing electronic circuits or components of various types, it is not limited to said application and covers all cases where equipment containing heat sources is located in a box. The heat sources can be constituted by active components such as transistors and passive components such as resistors.

At present, electronic equipment is usually installed in metal boxes. The nature of the metal from which these boxes are made is generally determined as a function of the envisaged application. The metals used all have a good capacity for conducting and dissipating the heat given off within the box by the electronic components. By placing the components with the greatest heat dissipation against the box wall, or by interposing between said components and the box wall a member which ensures a good thermal conductivity, the transfer and dissipation of heat are readily ensured. An illustration of this state of the art is provided by U.S. Pat. No. 4,330,812.

When the heat to be dissipated is greater, cooling ribs or fins can be provided on the outer face of the box wall, so as to increase the efficiency of convection phenomena. The heat dissipation obtained in this way is of a passive nature, because it does not have recourse to any auxiliary energy source.

These passive heat dissipation methods can be completed, if necessary, by procedures of an active nature when the heat quantities to be dissipated exceed the possibilities offered by the materials used. Among these active procedures, reference is made to internal or external ventilation, the addition of Peltier modules and the use of state change fluid circuits.

It is firstly pointed out that the invention only relates to passive heat dissipation methods. These methods can possibly be completed by those of an active nature, when this is justified by the heat quantities to be dissipated.

All known passive heat dissipation methods are based on the use of a box essentially made from a thermally conductive material.

However, certain applications may require the use for the production of said boxes of thermally insulating materials, such as moulded composite materials. Among these applications are all cases where a weight gain is desirable, which is particularly the case for electronic component boxes used in the aeronautical and space fields. The use of thermally insulating materials can be justified through their reduced cost, particularly in the general electronics field.

In these special applications, the traditional methods for ensuring the passive dissipation of the heat given off within boxes cannot be used. It is therefore necessary to use new passive heat dissipation methods, if it is not wished to use active methods in all cases, such methods being heavy and onerous.

SUMMARY OF THE INVENTION

The invention relates to a box essentially made from a thermally insulating material, which is equipped with passive heat dissipation means not significantly affecting the characteristics justifying the use of a thermally insulating material, such as low weight and reduced costs.

Therefore the present invention proposes a box for equipment, such as electronic components having heat sources distributed in accordance with a given cartography, said box having a rigid mechanical structure of a thermally insulating material and carries passive heat draining members made from a thermally conductive material, said members being arranged in such a way that each heat source is in contact with one of these members, wherein the heat drainage members comprise at least one implant mounted on the inner face of the rigid mechanical structure.

By choosing and dimensioning the heat draining members as a function of the heat quantity given off by each source and by carefully distributing said sources, it is possible to ensure the thermal stabilization of said sources in spite of the thermally insulating character of the structure.

The implants can be used when the heat source has a relatively low dissipated heat power of a maximum of approximately 5W, which is the case for numerous conventional electronic components.

In order to facilitate radial heat dissipation, each implant preferably has branches which are radially or tangentially oriented with respect to the contact zone between a heat source and said implant.

When the heat given off by certain of the sources cannot be completely dissipated by the implants, the heat draining members preferably comprise at least one insert traversing the rigid mechanical structure and carrying a radiator on the outside thereof. In this case, each radiator preferably has ribs or fins oriented perpendicularly with respect to the rigid mechanical structure and regularly distributed around the insert.

In certain special applications, the box also comprises at least one layer of a material ensuring the protection against X-rays of electronic equipment. In order to guarantee the continuity of said protection even at the location of the inserts, the latter can then be made from silver and/or have a cross-sectional increase below the X-ray protection layer. The improvement of the heat dissipation by a beryllium film covering the outer face of said protective material then makes it possible to prevent the emission of electrons by the walls of the box during the irradiation thereof by X-rays.

In a particularly interesting embodiment of the invention, the rigid mechanical structure is coated at least on its inner face by a film of a thermally conductive material. The inserts and/or implants are in contact with said film, which facilitates the heat dissipation.

Preferably, the film is made from nickel, aluminium, beryllium, copper or silver. It should be noted that these good electricity conducting materials also give the film the characteristics of a Faraday cage, which protects the electronic components contained in the box against electromagnetic waves, other than X-rays, when the box contains such components.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
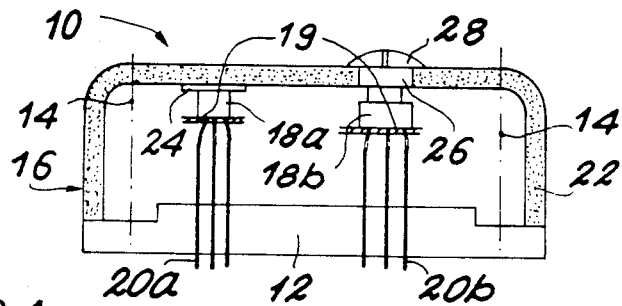
FIG. 1: A diagrammatic cross-sectional view of a box according to a first embodiment of the invention.

FIG. 1 very diagrammatically shows a box according to the invention, which is generally designated by the reference 10.

In the represented embodiment, it comprises a base 12 to which is fixed a cap or cover 16 by any appropriate means, such as screws (mixed lines 14 in FIG. 1).

According to the invention, box 10 contains equipment having heat sources distributed in accordance with a given cartography within the closed volume defined by the box. The equipment can in particular be constituted by active or passive electronic components, like components 18a, 18b in FIG. 1. These components are electrically connected to components outside the box by electrical conductors, such as conductors 20a, 20b in FIG. 1, said conductors e.g. traversing base 12.

In the embodiment shown in FIG. 1, electronic components such as 18a, 18b are kept in contact with heat dissipation elements 24, 26 fixed to the inner face or in the rigid structure 22 constituting cover 16 by any appropriate means. In general terms, components 18a, 18b are integral with a printed circuit 19, which is itself fixed to the box by an appropriate, not shown device.

According to an essential feature of the invention rigid structure 22, which ensures the mechanical protection of electronic components 18a, 18b is made from a thermally insulating material. Structure 22 can be obtained by moulding from a thermosetting plastic material such as bakelite, polyimide resins or silicones, optionally reinforced by organic fibres. As a non-limitative example, the rigid structure 22 can be made from a polyimide resin reinforced by glass fibres oriented in a random manner and marketed under the trademark designation KINEL 5504 owned by Rhone Poulenc Industries S.A., of Paris, France.

Among the components contained in box 10, only some of them constitute heat sources. Moreover, the components constituting heat sources can be placed in two categories, as a function of whether the heating power produced by each source is above or below the maximum heating power which can be dissipated by cover 16 for a given surface thereof associated with said source.

More specifically, after experimentally determining the heat exchange parameters (emissivity $\epsilon$ and convection $\alpha$ coefficient) of the material or materials constituting cover 16, a calculation is made of the heating power which can be dissipated by said material in a direction perpendicular to the surface of the cover. For each type of heat source, this is followed by a determination of the evolution law of said heating power which can be dissipated with the surface of the cover associated with said source. The shape of said surface is determined by the type of heat source. Thus, for a quasi-punctiform source, i.e. whose contact surface with the cover is small in all directions, a square surface is associated with said source. For a quasi-linear source, said surface has an elongated rectangular shape.

The maximum dissipatable heating power is determined on the basis of said evolution law for each heat source, by allocating to the latter a maximum given surface taking account of adjacent heat sources and a function of the permitted heating. Thus, it is possible to associate with an isolated heat source a larger surface permitting a greater maximum dissipatable heating power than in the case of sources which are close together. Advantageously the distribution of the sources in the box takes account of this observation.

This makes it possible to ensure the dissipation by the material constituting cover 16 of the heating power produced by certain of the heat sources located in the box.

However, for part of these sources, the dissipation is generally inadequate and it is then necessary to equip box 10 with accessories or ancillary members making it possible to passively dissipate the heat given off by said sources within the box.

As a function of the heat quantity produced by each of the sources, said accessories are constituted, for each source, either by an implant applied or moulded on the internal surface of rigid structure 22, or by an insert traversing said structure and with which is associated an external radiator. In all cases, these different accessories are made from a thermally conductive material, such as a metal. For example, the implants and radiators can be made from aluminum alloys, e.g. of types Au2GN and AU4G1 respectively, the inserts being made from copper.

In FIG. 1, component 18a constitutes a relatively low intensity heat source, although requiring the addition to the box of a heat dissipating accessory. The heat given off by this component is consequently dissipated by placing it in contact with a metal implant 24 carried by the internal surface of cover 16.

Component 18b constitutes a higher intensity heat source. The evacuation of said heat is consequently ensured by placing said component in contact with a metal insert 26 traversing the wall of cover 16 and with which is associated, outside the latter, a radiator 28.

Figure 2A:
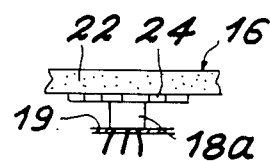
FIGS. 2a, 2b and 2b': Respectively a side view and two front views showing on a larger scale two constructional variants of an implant mounted on the inner face of the box so that, according to the invention, it is possible to dissipate the heat given off by a component considered to be quasi-punctiform having a contact distributed with said implant.
Figure 2B:
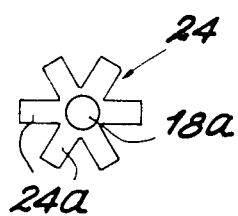
Figure 2B:
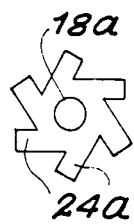

FIGS. 2a, 2b and 2b' show an embodiment of an implant 24 according to the invention, in the case where the heat source constituting component 18a is quasi-punctiform. The contact zone or surface between component 18a and implant 24 is consequently relatively limited in all directions and is e.g. circular in FIG. 2b. The thus defined contact zone between component 18a and implant 24 constitutes the centre of the latter. In order to drain the heat given off by the component radially (FIG. 2b) or tangentially (FIG. 2b') to the outside, implant 24 also has branches 24a radially oriented with respect to said central contact zone and regularly distributed around the same. In the embodiment shown in FIG. 2b, there are six such branches, so that implant 24 is shaped like a star with six arms or branches. The number of branches of the implant can differ from six and can e.g. be reduced to four if the heat given off by the component is not as great. The configuration of the implants is determined in each particular case, as a function of the importance attached to the dimensional (surface) and weight (mass factors), bearing in mind the heating power to be evacuated.

Figure 3A:
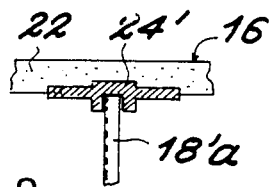
FIGS. 3a and 3b: Views comparable to FIGS. 2a and 2b showing an implant able to discharge the heat dissipated by a component in quasi-linear contact with said implant.
Figure 3B:
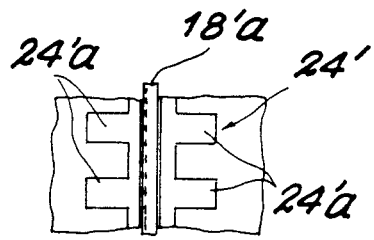

FIGS. 3a and 3b show an embodiment of an implant 24' for evacuating the heat given off by a component, such as a card or board 18'a carrying electronic circuits, said component being quasi-linear. The contact between component 18'a and implant 24' therefore takes place along a long and relatively narrow rectangular surface.

In this case, implant 24' comprises a rectangular central part surrounding the contact zone between card 18'a and the implant. On either side of its central portion, implant 24' also has branches 24'a oriented perpendicularly to said central portion and regularly spaced.

In this case these branches ensure the draining of the heat towards the outside and therefore the thermal stabilization of card 18'a, to the extent that the configuration of said implant (shape, mass, surface, etc.) is adapted to the power dissipated by said card or board. Obviously, other implant shapes can be used, particularly in the case where the source is neither quasi-punctiform, nor quasi-linear.

In examplified manner, in the case of a quasi-punctiform load dissipating a heating power of 2.4 W, it would be possible to use a cross-shaped implant, each branch having a length of 30 mm and a width of 10 mm, the weight of the implant being 0.7 g. In the case of a quasi-punctiform load dissipating a charge of 4 W, use would e.g. be made of an implant with six branches, the dimensions of each pair of opposite branches being 60 mm×10 mm and the implant weight being 2.2 g. This solution is suitable for sources with a heating power below 5 W.

Implants 24, 24' can be fixed to the internal surface of the box cover by any appropriate means. In the case of implant 24 of FIG. 2a, the latter is shown as being bonded to said internal face. However, in FIG. 3, implant 24' is shown as being partly inserted in the structure of the box during the moulding thereof.

Moreover, implants 24, 24' can be advantageously used for supporting components 18a, 18'a and for this purpose the components are fitted into said implants (FIGS. 3a and 3b).

Figure 4A:
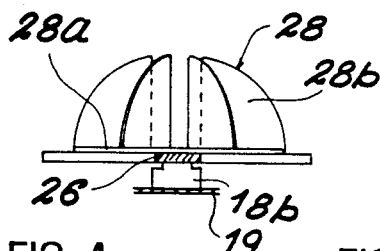
FIGS. 4a and 4b: Side and front views on a larger scale showing an insert and its radiator ensuring, according to the invention, the dissipation of the heat given off by a heat quantity dissipating component, such as an implant, which does not permit the complete removal of said heat.
Figure 4B:
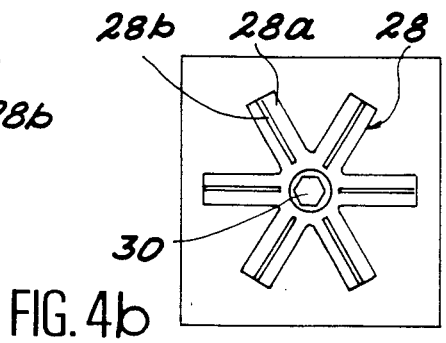

FIGS. 4a and 4b show on a larger scale an embodiment of an insert 26 and its associated radiator 28. Insert 26 is constituted by a metal block, e.g. of copper and having a cylindrical shape in the case of a quasi-punctiform heat source. This block traverses the wall of box 16 and is in close contact with component 18b to be cooled. Radiator 28 can be fixed to the metal block outside the box by any appropriate means, such as a screw 30. The radiator is fixed to the insert so as to ensure a good thermal conductivity at the contact.

Radiator 28 comprises a base 28a, which is e.g. shaped like a star with six arms, engaged with the insert 26 and the outer surface of box 16 by screw 30. On each of its branches, base 28a carries a rib 28b in the form of a circular sector, which projects perpendicularly to the outer face of the box. The branches of base 28a and ribs 28b are regularly distributed around the axis of insert 26.

Obviously, the dimensions of the metal block constituting insert 26, in the same way as the dimensions of the base and the ribs constituting radiator 28 are determined as a function of the heating power to be dissipated. For example, the copper insert weighs approximately 3.9 g for a radius of 6 mm and a radiator weight of 8.2 g, each pair of branches of base 28a having the dimensions 60 mm×10 mm and the radius of each rib 28b is 25 mm. A power of 10 to 12 W can be dissipated by such an assembly, as a function of the accepted T. For example, a T of 60° C. brings about 7 W dissipation.

Obviously the cartographic distribution of the heat sources within the box is determined beforehand, so that the distance between said sources increases as the heating power dissipated by them increases.

Figure 5:
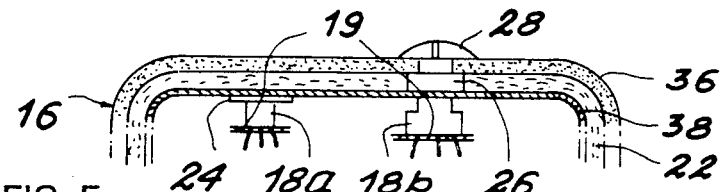
FIG. 5: A view comparable to FIG. 1 illustrating a second embodiment of the invention.

FIG. 5 diagrammatically illustrates an embodiment of the invention, according to which cover 16 is no longer solely constituted by a rigid mechanical structure 22, but also comprises an outer layer made from a material 36 for protecting the components located in box 10 against X-rays.

Further details concerning the constitution and construction of the protective layer 36 can be obtained by referring to French patent application No. 8605442, filed on Apr. 16, 1986 by Aerospatiale (S.N.I.).

When it is necessary to provide such an X-ray protection, the continuity of the protection must be obtained even at the inserts 26 traversing the material ensuring said protection.

In order to ensure the opacity to X-rays of the box, inserts 26 can be made from silver, said metal bringing about an adequate attenuation for a box thickness, which can e.g. be 1.73 mm for a wide range of applications.

The opacity can also be obtained no matter what the material from which insert 26 is made (copper, molybdenum, tin, silver, etc.) by guaranteeing the necessary filtering thickness, no matter what the trajectory of the photons. As illustrated in FIG. 5, for this purpose there is an increase in the cross-section of insert 26 below the protective layer made from material 36, i.e. level with the passage through structure 22.

It is clear that the geometry of the inserts 26 defined hereinbefore also applies if the material constituting the outer layer 36 ensures the rigidity conditions required of structure 22. Thus, in this case, the increase in the cross-section of insert 26 is below the wall of material layer 36, which then simultaneously fulfils the rigidity and X-ray protection conditions, but whilst not ensuring good thermal conductivity conditions. It should be noted that the choice between the use of a material ensuring both the rigidity and X-ray protection functions, or the use of two materials separately ensuring these functions is linked with the rigidity and X-ray opacity levels which it is wished to obtain.

FIG. 5 shows that it is also possible to improve the thermal stabilization of the heat sources located in the box by at least partly coating the internal surface of structure 22 with a layer 38 of a thermally conductive material, such as a metal. Implants 24, as well as inserts 26 are in contact with said layer 38, so that the thermal dissipation is improved.

In the case where box 10 comprises numerous inserts 26, a layer of a thermally conductive material can be provided on the outer surface of the box, i.e. outside layer 36 of FIG. 5. Layer 38 is e.g. approximately 0.1 mm thick. A metal is preferably used for producing layer or layers 38, e.g. nickel, aluminium, beryllium, copper or silver.

It should also be noted that layer 38 forms a Faraday cage which, apart from its thermal dissipation function, makes it possible to protect the circuits within the box against electromagnetic waves, other than X-rays.

In addition, when a layer like layer 38 is placed outside coating 36 and when it is made from beryllium, during irradiation of the box by X-rays, it makes it possible to prevent the emission of electrons by the material constituting the X-ray protection layer 36.

Obviously, the invention is not limited to the embodiments described in exemplified manner hereinbefore and covers all variants thereof.

In particular, it has already been observed that the heat sources placed within the box according to the invention can be of all types and are not limited to electronic components.

Moreover, it should be noted that the invention is independent of the given shape of the box, said shape being essentially determined as a function of the components contained therein.

Finally, a layer of conductive material like layer 38 can be used no matter what the structure of the box. One or two layers such as layer 38 can in particular be used in a box like that described with reference to FIG. 1.

What is claimed is:

1. A box for equipment, such as electronic components constituting heat sources distributed within said box, said box having a rigid mechanical structure of a thermally insulating material carrying passive heat draining members made from a thermally conductive material, said members being arranged in such a way that each heat source is in contact with one of said members, wherein the heat transfer members comprise at least one implant mounted on the inner face of the rigid mechanical structure.

2. A box according to claim 1, wherein each implant has branches oriented radially with respect to a contact zone between a heat source and said implant.

3. A box according to claim 1, wherein the heat transfer members comprise at least one insert traversing the rigid mechanical structure and carrying a radiator outside the same.

4. A box according to claim 3, wherein each radiator has ribs oriented perpendicularly to the rigid mechanical structure and regularly distributed around the insert.

5. A box according to claim 3, wherein it comprises at least one layer of a material for protecting the equipment against X-rays.

6. A box according to claim 5, wherein each insert is made from silver.

7. A box according to claim 5, wherein each insert has a cross-sectional increase below the layer of X-ray protection material.

8. A box according to claim 1, wherein the rigid mechanical structure is coated at least on its inner face with a film of thermally conductive material.

9. A box according to claim 8, wherein the film is made from a material chosen from the group including nickel, aluminium, beryllium, copper and silver.

10. A box according to claim 1, wherein each implant has branches oriented tangentially with respect to a contact zone between a heat source and said implant.

11. A box for equipment, such as electronic components constituting heat sources distributed within said box, the latter having a rigid mechanical structure of a thermally insulating material, and at least one layer of a material for protecting the equipment against X-rays, said box carrying passive heat transfer members made from a thermally conductive material, said members being arranged in such a way that each heat source is in contact with one of said members, wherein the heat transfer members comprise at least one insert traversing the rigid mechanical structure and carrying a radiator outside the latter, said insert being made from silver.

12. A box for equipment, such as electronic components constituting heat sources distributed within said box, the latter having a rigid mechanical structure of a thermally insulating material, and at least one layer of a material for protecting the equipment against X-rays, said box carrying passive heat transfer members made from a thermally conductive material, said members being arranged in such a way that each heat source is in contact with one of said members, wherein the heat transfer members comprise at least one insert traversing the rigid mechanical structure and carrying a radiator outside the latter, said insert having a part of increased cross-section located within said structure, below the layer of X-ray protection material.

13. A box for equipment, such as electronic components constituting heat sources distributed within said box, the latter having a rigid mechanical structure of a thermally insulating material for protecting the equipment against X-rays, said box carrying passive heat transfer members made from a thermally conductive material, said members being arranged in such a way that each heat source is in contact with one of these members, wherein the heat transfer members comprise at least one insert traversing the rigid mechanical structure and carrying a radiator outside the latter, said insert being made from silver.

14. A box for equipment, such as electronic components constituting heat sources distributed within said box, the latter having a rigid mechanical structure of a thermally insulating material for protecting the equipment against X-rays, said box carrying passive heat transfer members made from a thermally conductive material, said members being arranged in such a way that each heat source is in contact with one of these members, wherein the heat transfer members comprise at least one insert traversing the rigid mechanical structure and carrying a radiator outside the latter, said insert having a part of increased cross-section located within said box, below said rigid mechanical structure.

* * * * *